(12) United States Patent
Alers et al.

(10) Patent No.: US 6,830,942 B1
(45) Date of Patent: Dec. 14, 2004

(54) METHOD FOR PROCESSING SILICON WORKPIECES USING HYBRID OPTICAL THERMOMETER SYSTEM

(75) Inventors: Glenn B. Alers, Chatham; Robert J. Chichester, Somerville; Don X. Sun, Warren; Gordon Albert Thomas, Princeton, all of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/286,929

(22) Filed: Apr. 6, 1999

(51) Int. Cl.[7] .............................................. G01R 31/26
(52) U.S. Cl. ........................................ 438/16; 374/121
(58) Field of Search ............................. 438/16, 7, 10, 438/14, 17, 18; 374/121, 123

(56) References Cited

U.S. PATENT DOCUMENTS 5,098,199 A * 3/1992 Amith ........................ 374/121

* cited by examiner

Primary Examiner—David Nelms
Assistant Examiner—Quoc Hoang
(74) Attorney, Agent, or Firm—Lowenstein Sandler PC (57) ABSTRACT

A method is disclosed for processing a silicon workpiece including a hybrid thermometer system for measuring and controlling the processing temperature where fabrication materials have been or are being applied to the workpiece. The hybrid thermometer system uses optical reflectance and another thermometer technique, such as a thermocouple and/or a pyrometer. Real-time spectral data are compared to values in a spectrum library to determine the "surface conditions". A decision is then made based on the surface conditions as to how the temperature is measured, e.g., with optical reflectance, a pyrometer, or a thermocouple, and the temperature is measured using the appropriately selected technique. Utilizing the hybrid thermometer system, the temperature of a silicon workpiece may be accurately measured at low temperatures while accounting for the presence of fabrication materials.

15 Claims, 6 Drawing Sheets

METHOD FOR PROCESSING SILICON WORKPIECES USING HYBRID OPTICAL THERMOMETER SYSTEM

RELATED APPLICATIONS

This application is related to U.S. patent application Ser. No. 09/080,430, filed May 19, 1998 by Alers et al., which is incorporated herein by reference.

FIELD OF THE INVENTION

The present invention relates to a method for processing silicon devices and, in particular, to a method which uses in a hybrid optical thermometer system for measuring and controlling the temperature of a silicon workpiece as it is processed.

BACKGROUND OF THE INVENTION

An apparatus for carefully controlling the temperature of silicon workpieces is an important part of silicon device fabrication. There have been many systems developed for use in fabricating silicon devices that essentially are designed to control the temperature of a workpiece while the processing is being carried out. A typical silicon workpiece heating station comprises a workpiece support, apparatus for measuring the temperature of the workpiece, and controllable heating elements, such as infrared bulbs. Electronic circuitry may receive the measured temperature and control the heating elements to achieve the desired temperature as a function of time.

With advances in silicon processing technology, there has been a corresponding need for improved workpiece heating stations and temperature control. One major difficulty relates to efforts to measure and control the temperature of a workpiece where temperatures below 500° C. are used in the processing steps. Another difficulty relates to measuring and controlling the temperature of the workpiece that has been or is being modified with deposited materials. In fabricating integrated circuit devices, there are numerous ways in which a silicon workpiece may be processed that involve depositing materials onto the silicon workpiece or removing portions of these deposited materials. The presence of the fabrication materials used in such processing impacts upon the measurement of the workpiece temperature. Typically, in these methods the processing is performed on at least one surface of the workpiece, making it difficult to obtain accurate measurements of the workpiece as materials have been or are being applied thereon.

One approach for measuring and controlling the temperature of workpieces involves use of thermocouples. Although thermocouples are effective over a wide temperature range, to be accurate they must be attached directly to the workpiece; this attachment is costly, time-consuming, and presents risks of contaminating the workpiece. Optical pyrometers are advantageous for use in measuring and controlling the temperature because they do not have to be attached to the workpiece. However, they have reduced accuracy at lower temperatures; at temperatures below 500° C., they lack the accuracy needed for silicon processing. Pyrometers also require a different calibration to convert their signal to a temperature depending on the silicon surface condition. Recently, improved pyrometers have been developed which invoke a ripple technique, taking advantage of the thermal modulation of the AC current which powers the heating lamps. Such improved pyrometers can be controlled to an accuracy of 12° C. at temperatures near 1100° C., and pyrometers using this technique are effective to near 600° C., though with decreasing accuracy. But lower temperatures and higher accuracy are still needed, as is a method of accounting for the surface condition.

Thus, improved temperature measurement devices and methods are desired for use in silicon device fabrication which achieve greater accuracy at lower temperatures and may be used where materials have been or are being applied to the silicon workpieces.

SUMMARY OF THE INVENTION

Summarily described, the invention embraces a method for processing integrated circuits on silicon wafers, using a method for measuring the temperature of a silicon workpiece. A thermometry method that allows the control of integrated circuit processing comprises the steps of providing a conversion system for transforming spectral data to a value of temperature, and measuring this spectral data with optical reflectance. The optical reflectance thermometry comprises directing a beam of polarized light including ultraviolet light onto the silicon workpiece so the light is reflected off the workpiece to a spectrum analyzer; analyzing the spectrum of the light reflected off the workpiece to obtain spectral data; and converting the spectral data to information about the surface of the wafer. Using this information, a thermometry method is chosen, the temperature is determined, and the processing is controlled.

Using the inventive optical reflectance system, a hybrid thermometer system is provided to measure and control the temperature of a silicon workpiece while accounting for the presence of fabrication materials that have been or are being applied to the workpiece. This hybrid system involves use of a plurality of and preferably three types of thermometers, e.g., a thermocouple, a pyrometer, and a reflectance thermometer, disposed adjacent the silicon workpiece. The thermometers are utilized to obtain real-time spectral data accounting for the presence of fabrication materials. A library of spectral data (e.g., a "spectrum library"), is measured prior to the real-time application using known, controlled conditions. The real-time spectral data is compared to values in the spectrum library to determine the type and concentration of fabrication materials applied or being applied (e.g., the "surface conditions"). A decision is then made based on the surface conditions as to how the temperature should be measured, e.g., with optical reflectance, a pyrometer, or a thermocouple, and the temperature is measured using the appropriately selected technique. The spectrum library may be created or enhanced by utilizing the steps of providing a test substrate and a plurality of test fabrication materials, measuring the temperature of the test substrate and test fabrication materials as the fabrication materials are applied using a thermocouple that is attached to the test substrate and optical reflectance thermometry, and decomposing the spectral data into a basis set of functions and coefficients. The values obtained in measuring known test fabrication materials may then be used to provide the spectrum library.

BRIEF DESCRIPTION OF THE DRAWINGS

For a better understanding of the invention, an exemplary embodiment is described below, considered together with the accompanying drawings, in which.

It is to be understood that these drawings are for the purposes of illustrating the concepts of the invention and except for the graphs are not to scale.

DETAILED DESCRIPTION OF THE INVENTION

With this invention, a method is provided for processing materials on silicon workpieces that uses an improved system for measuring and controlling the temperature of the materials. With this system, spectral data is obtained by reflecting UV and visible light off the silicon workpiece as it is being fabricated. This spectral data may be used to decide which of several temperature measurements to use to measure the workpiece temperature without having to contact the surface of the workpiece. With this hybrid optical thermometer system, optical reflectance thermometry and one or more other thermometry techniques, such as thermocouple or pyrometric thermometry, is used to accurately measure and control a silicon workpiece as fabrication materials are being applied. Initially, for the hybrid thermometry system, a library of spectral data (referred to as a "spectrum library"), is provided which may include a basis set of reflectance functions and coefficients describing the reflectance of known fabrication materials and surface conditions and temperatures thereof. The spectrum library is then compared with real-time reflectance values to determine which thermometry technique will be applied. Preferably the best (i.e., most accurate) thermometry technique is selected and applied to measure and control the temperature of the workpiece as fabrication materials are being applied.

Figure 1:
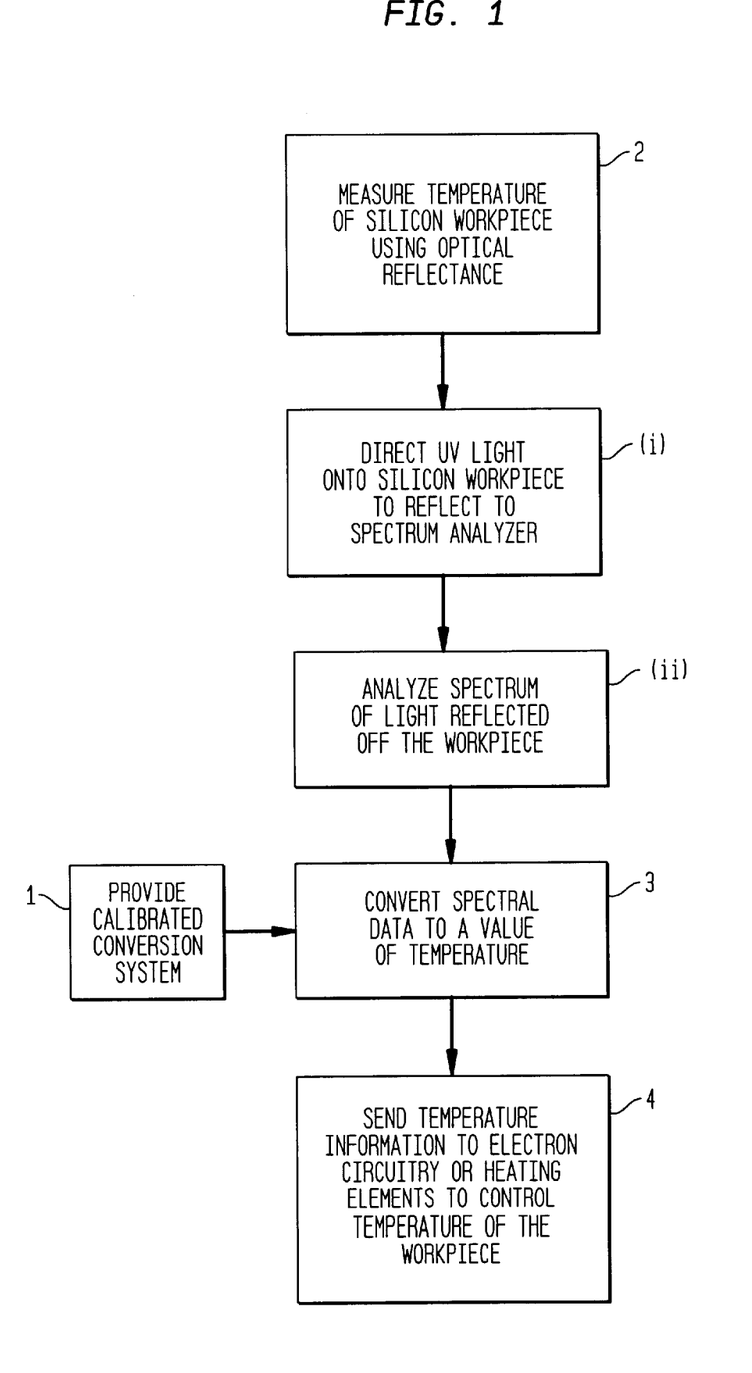
FIG. 1 is a block diagram of steps involved in the inventive optical reflectance method.

Referring to FIG. 1, there is shown a block diagram of steps of the optical reflectance method. A method and apparatus for performing optical reflectance are described in U.S. patent application Ser. No. 09/080,430, filed May 19, 1998 by Alers et al, titled "Apparatus for Processing Silicon Devices with Improved Temperature Control," which is assigned to the present assignee, has common inventors with this application, and is incorporated herein by reference (hereinafter the "'430 application"). A first step of the method, shown in block 1, comprises providing a conversion system for use in converting spectral data to a value of temperature or information about the surface condition of a silicon workpiece. A second step, shown in block 2, comprises measuring the temperature of the silicon workpiece applying optical reflectance thermometry. The step of measuring the temperature of the workpiece using optical reflectance thermometry comprises the substeps of (i) directing a beam of polarized light including ultraviolet light onto the silicon workpiece so the ultraviolet light is reflected off the workpiece to a spectrum analyzer; and (ii) analyzing the spectrum of the reflected light to obtain spectral data. As shown in block 3, the conversion system is used to convert the spectral data to a value of temperature. The conversion system should be calibrated, a calibration procedure being described in the '430 application. As shown in block 4, information regarding the value of temperature may then be sent to electronic circuitry or heating elements to control the temperature of the workpiece.

Figure 2:
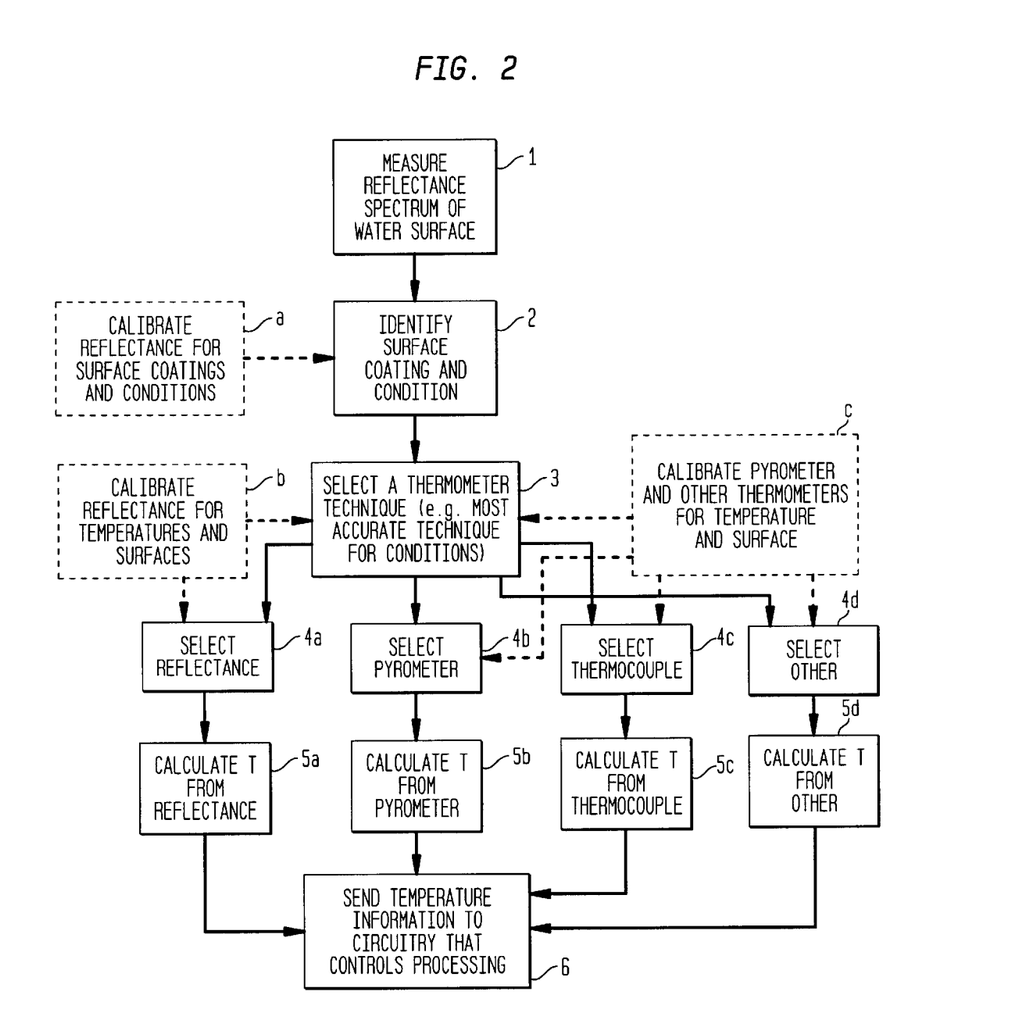
FIG. 2 is a block diagram of steps involved in the inventive hybrid thermometry system.

The hybrid thermometry system of this invention may utilize optical reflectance thermometry to accurately measure the temperature of a workpiece as it is being coated, etched, or the like, with fabrication materials. FIG. 2 sets forth steps for the hybrid thermometry system that accounts for the presence of one or more fabrication materials that have been or are being applied to the silicon workpiece during processing. Processing techniques for the silicon workpiece may include, for example, film deposition (e.g., by chemical vapor deposition, sputtering, evaporation, or epitaxy), diffusion and ion implantation, wet chemical and dry etching, annealing, and so forth. In performing these processing techniques, one or more materials may be applied to the workpiece, referred to herein generally as "fabrication materials." The fabrication materials may impact upon the temperature of the silicon workpiece during deposition and may affect the temperature measurement if they alter the back surface of the silicon workpiece. Applying the method of FIG. 2, an accurate measurement may still be obtained.

The hybrid thermometry system uses a combination of measurement techniques including optical reflectance thermometry, as previously described, and one or more other thermometry techniques, such as a pyrometer, thermocouple, or other technique. With the inventive method, the silicon workpiece is analyzed before processing to determine the surface condition, including the type and thickness (or concentration) of the materials and roughness of the surface (for ease of reference these parameters may be referred to herein as the "surface conditions"). Depending on the surface conditions, a decision is made, e.g., using a software program or computer, as to which measurement technique should be used during processing, e.g., preferably which is most accurate. The measurement is taken and the temperature information sent to electronic circuitry to control the silicon device processing, including the heating elements to control the temperature of the workpiece and deposition rate.

More particularly, FIG. 2 is a block diagram showing the steps of this method. Initially, calibration steps (e.g, blocks a, b, c), are performed to provide a library of data, which may include a surface reflectance library (block a), a temperature reflectance library (block b), and pyrometer and thermocouple temperature libraries (block c). The spectrum library is stored in a memory system, such as in a computer, for comparison with real-time data. In FIG. 2, the calibration steps are set forth in blocks defined by dashed lines as these steps are optional in the sense that they may be performed by a third party other than the user of the hybrid thermometry system. The spectrum library may be delivered to the user of the method from any source, or the user of the method may create a library before practicing the method. A user of the method also may enlarge or enhance the library, e.g., as new fabrication materials are selected and applied in the processing of the silicon devices.

Figure 2A:
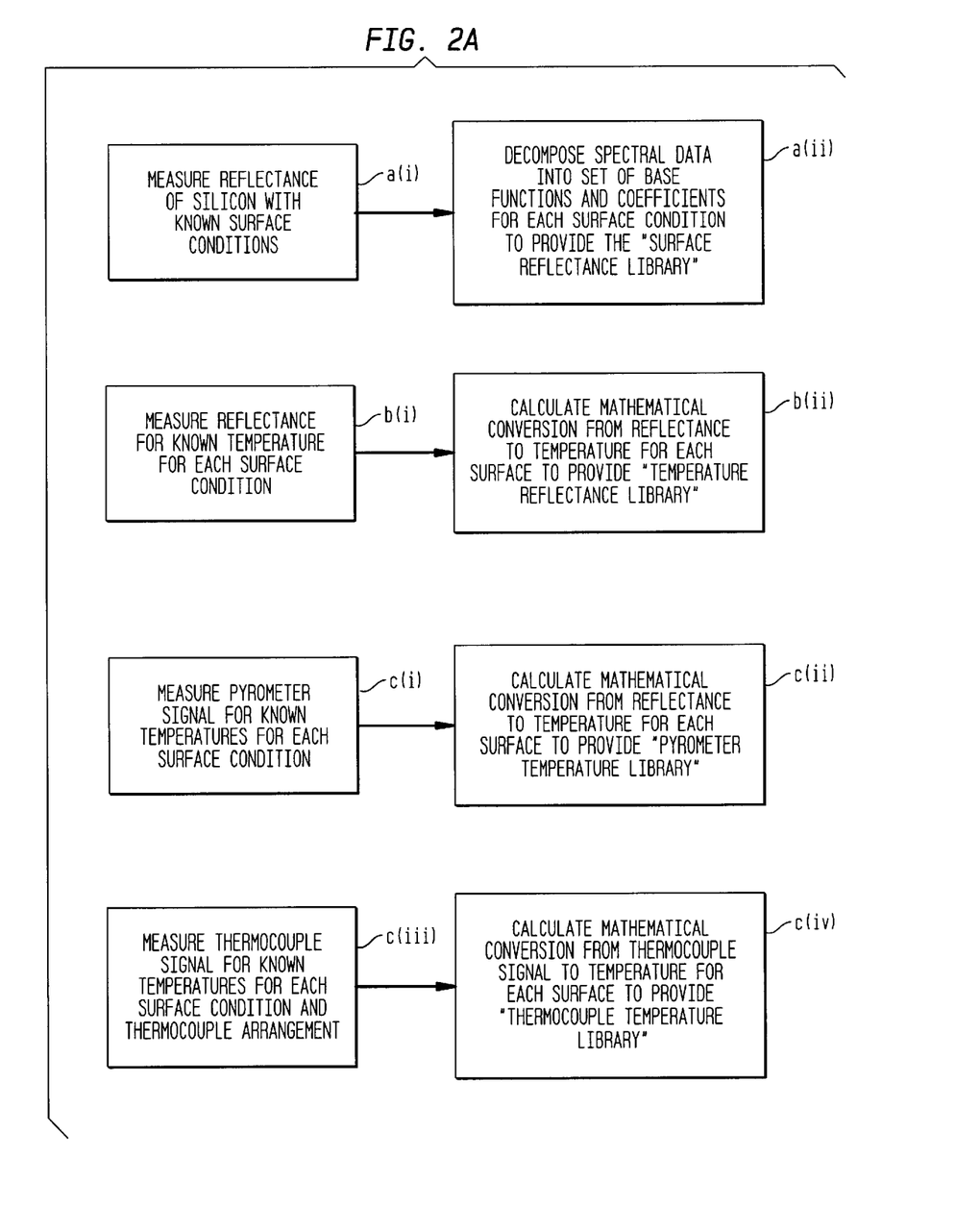
FIG. 2A is a block diagram of calibration steps related to the inventive hybrid thermometry system.

Steps involved in creating or enlarging a spectrum library are set forth in FIG. 2A. These calibrations steps may be performed by providing one or more known test fabrication materials for application to a test substrate, with the test materials being known and reflecting the type of fabrication materials that may be applied to the workpiece either before or during processing. The reflectance of silicon with known surface conditions is measured with reflectance (FIG. 2A, block a)i)), and the spectrum data is decomposed into a set of basis functions and coefficients for each surface condition to form a "surface reflectance library" (block a)ii)). For each surface condition, reflectance is measured at known temperatures (block b)i)), and the mathematical conversion from reflectance to temperature is calculated for each surface to provide a "temperature reflectance library" (block b)ii)). Pyrometer (block c)i)) and thermocouple (block c)iii)) signals are measured for known temperatures for each surface condition and thermocouple arrangement, and the mathematical conversion from reflectance to temperature is calculated for each surface to provide the "pyrometer temperature library" (block c)ii)), and "thermocouple temperature library" (block c)iv)). If another measurement technique is used (e.g., block 4d of FIG. 2), the technique may be calibrated in like fashion. Optical reflectance thermometry as described in the '403 application may be applied to measure the reflectance.

In applying the hybrid thermometry system, once the test library is provided, real-time data is obtained. A spectrum is taken of the surface conditions, during actual processing of the silicon workpiece, using a reflectance method such as that shown in FIG. 3 (FIG. 2, block 1). This reflectance method may comprise the optical reflectance method previously described, but it also could include another reflectance method known in the field, the important consideration being that real-time spectral data be obtained of the surface conditions during processing and that the same method be used in calibration. Using the reflectance spectrum and the calibration performed per block a, the surface coating and conditions are identified (block 2, FIG. 2). The step of identification may be performed by decomposing the real-time spectral data into a basis set of functions and coefficients (block 3), which are compared with coefficients in the spectrum library (FIG. 2A, block a)ii)). Through this comparison, the actual surface conditions are determined and a thermometry measurement technique is selected, e.g., based on which technique will provide the most accurate measurement given the surface conditions (FIG. 2, block 3).

For example, applying a preferred embodiment of the invention, where the identification step (e.g., block 2), instructs that a very thin coating of $SiO_2$ has been applied by previous processing, optical reflectance thermometry is used with the calibration for that coating (block 4a). Where the comparison reveals a thick coating of SiN, a pyrometer is preferably used with the calibration determined for that material (block 4b). Where the comparison of the real-time data with the spectrum data does not result in a "match," e.g., the surface conditions are unknown, a thermocouple may be used clock 4c). Of course, other measurement techniques may be used and incorporated into this method, in addition to or in place of the techniques described (blocks 4d, 5d), the important consideration being that the comparison data be applied to determine the measurement technique which is calculated to be most accurate for those conditions (block 3). This method enables use of the most effective thermometer system based on the calibration information. Signal from more than one thermometer preferably would be used at once to check the working of the thermometer and deposition system. A software computer program may be developed using principles known in the field to carry out this step (that is, the step of block 3). Once this decision is made, data is used from the appropriate thermometer and the temperature is obtained, and the temperature information is sent (e.g., via computer controls), to electronic circuitry or heating elements to control the processing of the workpiece (FIG. 2, step 6), including its temperature and the rate of deposition of the materials.

A device that may be used for performing the optical reflectance thermometry under computer control, and which may be incorporated into the hybrid thermometry system, is described in the '430 application. The device of the '430 application measures the temperature of the workpiece with ultraviolet light directed onto and reflected off the surface of the workpiece; the light is directed to a spectrum analyzer and computer, which converts the spectral data to a value of temperature. In the '430 application, the conversion of the spectral data to a value of temperature includes an initial step of calibration with a test substrate which utilizes a thermometer such as a thermocouple and the spectrum of reflected light.

Figure 3:
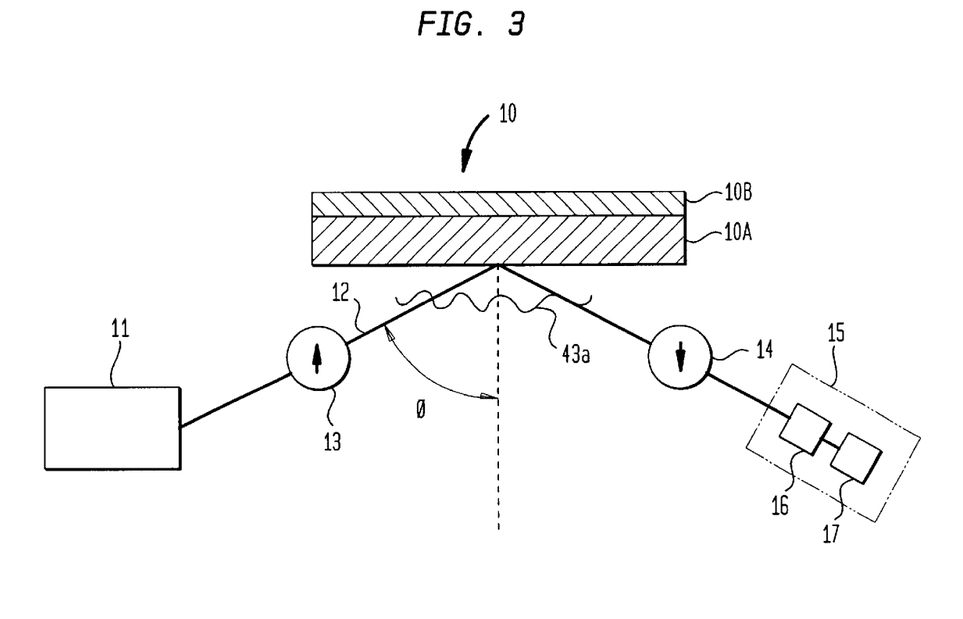
FIG. 3 is a schematic diagram of an apparatus that may be used in performing the inventive optical reflectance method to perform the decision in step 5 of FIG. 2 and to measure the temperature of a silicon workpiece if appropriate.

FIG. 3 illustrates a silicon device fabrication apparatus that may be used in performing steps of the methods of FIGS. 1 and 2. A silicon workpiece 10 includes an exposed surface 10A and an active surface 10B, where micro-circuits or other devices are to be formed or modified. The apparatus comprises a source 11 of a beam 12 of ultraviolet light directed through a polarizer 13 onto a surface 10A of silicon workpiece 10, advantageously at a relatively large angle of incidence $\phi$ (advantageously $\phi > 45°$). It further includes an arrangement for receiving the beam reflected from the silicon workpiece comprising a second polarizer 14 and spectrum analyzing apparatus 15 such as a dispersion element 16 and an array of photodetectors 17. In a preferred embodiment, the source 11 is a deuterium lamp, which emits ultraviolet and visible light strongly in the range of wavelengths from 250 to 550 nm. The angle of incidence is preferably 45° to 80°. The polarizers 13, 14 are preferably linear polarizers, and the spectrum analyzer 15 may comprise an optical grating dispersion element 16 and an array of silicon photodetectors 17.

Using the device of FIG. 2, light in the wavelength range 250–550 nm is directed by a collimating lens (not shown) as a beam 12 through the polarizer 13 onto the silicon surface (step 2(i) of FIG. 1). Additionally, fabrication materials may be present adjacent the silicon surface 10A, as shown schematically at line 43a. When the fabrication materials are applied, the beam 12 may reflect off these materials as well. Preferably, the light is directed onto the silicon workpiece (and optionally the fabrication materials 43a), at an angle $\phi$ (most preferably $\phi \approx 70°$), at which the reflected intensity from silicon is sensitive to polarization The polarizer 13 preferably produces a beam that is linearly polarized with the electric field vector oriented so that it has substantial components both parallel and perpendicular to the silicon surface. A suitable polarization direction is 45° from the plane of incidence formed by the light beam 12 and perpendicular to the silicon surface.

The reflected light beam (or beams) may be modified by the second polarizer 14, gathered by a lens (not shown) and spectrally analyzed (step 2(ii) of FIG. 1). The second polarizer 14 advantageously is oriented as a cross polarizer compared to the first so as to null out (substantially reduce) polarized light over a wide range of wavelengths. This nulling out is possible because the reflectivity of silicon is nearly constant over this wavelength range. In contrast, at wavelengths shorter than about 450 nm, the silicon reflectivity varies substantially. The reflectivity of silicon in the UV range changes with temperature in a way that is intrinsic to silicon and is insensitive to impurities at typical concentration levels. Thus, these changes may be used in the inventive method to measure temperature.

Figure 4:
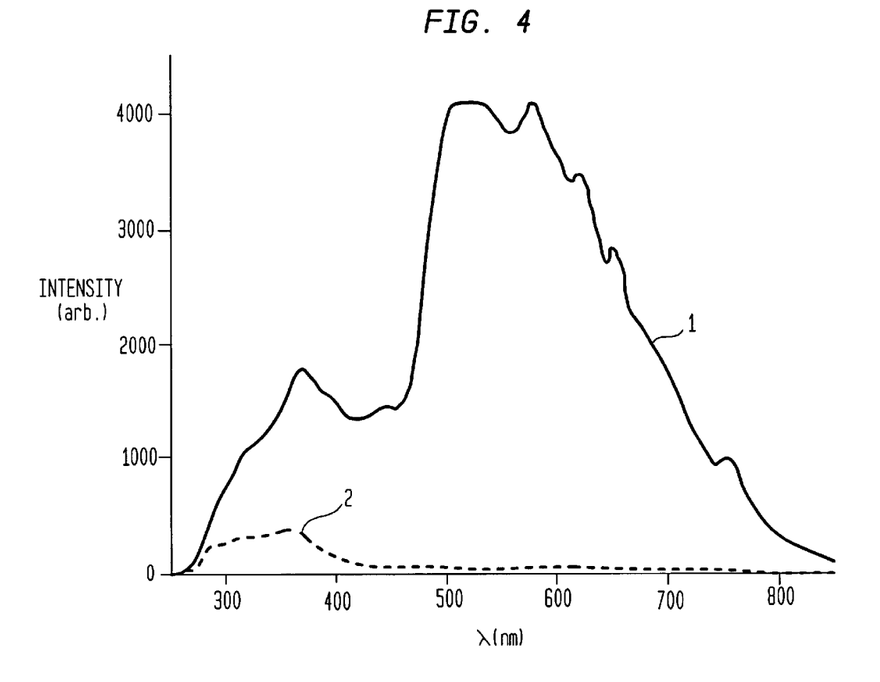
FIGS. 4 and 5 are spectra of polarized UV light reflected from a silicon workpiece at different temperatures, polarizations and normalizations.

FIG. 4 is a graph showing intensity as a function of wavelength for polarized light reflecting off a silicon surface. Curve 1 (the upper curve) shows the spectrum with the second polarizer 14 oriented far from "null". Curve 2 (the lower curve) shows the intensity with the second polarizer 14 rotated to the position for "null". As can be seen, the nulling polarizer essentially eliminates visible and IR (with wavelengths >450 nm) light, leaving some of the UV portion of the reflected intensity.

At each photodetector (17 of FIG. 3), the optical signal for a small range of wavelengths may be converted to an electrical signal corresponding to the quantity of light in the range. A set of paired signals indicative of the intensities and the wavelengths at each of a plurality of different wavelength ranges may be digitized and transmitted to a conversion system comprising a computer (not shown).

Figure 5:
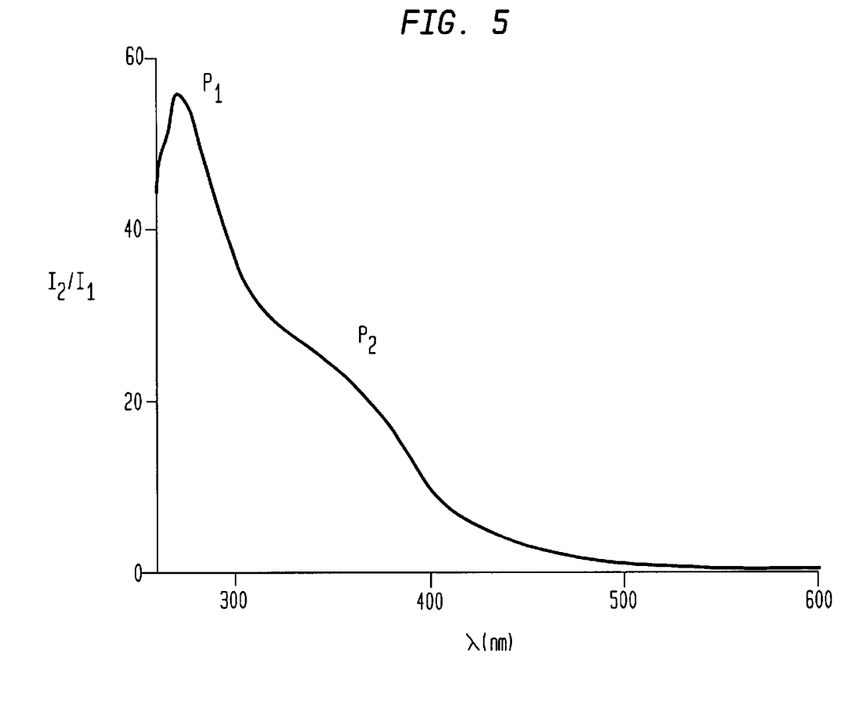

FIG. 5 is a plot of the residual reflectance formed by the ratio of the intensity curves shown in FIG. 4. At each UV wavelength, the intensity on curve 2 is divided (e.g., in a computer) by the reflected intensity on curve 1. As can be seen, the UV spectrum is characterized by two peaks, $P_1$ and $P_2$. These peaks are due to the silicon interband critical points $E'_0$ and $E_1$. The two peaks are characteristic of silicon, and they shift in position and in width with changes in temperature. The changes in this ratio spectrum are approximately 1% for each 10° C. change in temperature, providing a direct measure of the temperature change. Although FIGS. 4 and 5 plot reflectance data for a pure silicon workpiece (e.g., where no fabrication materials are present), the same principles may be used to obtain spectral data where fabrication materials are being applied.

A software program may be used to analyze the residual reflectance spectrum (e.g., FIG. 5) and convert the spectral data to a value of temperature. The residual reflectance spectrum of a workpiece is fitted with reflectance functions to determine the reflectance variables. These reflectance variables then serve as input for calculating the temperature using temperature functions and constants. Temperature functions and constants used in the conversion may be determined by a calibration procedure. Additionally, calibration procedures may be performed to provide the spectrum library to account for the presence of fabrication materials during processing (FIG. 2A).

In operation, once the system is calibrated for the presence of fabrication materials (e.g., the spectrum library is provided), the optical reflectance thermometry can be carried out on the silicon workpiece as it is being processed. The UV light may be directed onto the workpiece, as described above, while fabrication materials are applied to provide real-time spectral data (FIG. 2, block 1). Light will be reflected off the workpiece 10A and also off the fabrication materials 43a adjacent the workpiece. The spectral data thereby obtained can be used to determine the composition of the fabrication materials or combination of materials applied to or being applied to the wafer by comparing the real-time spectral data with the spectrum library (FIG. 2, block 2), and this information can be used in converting the spectral data to a value of temperature.

Figure 6:
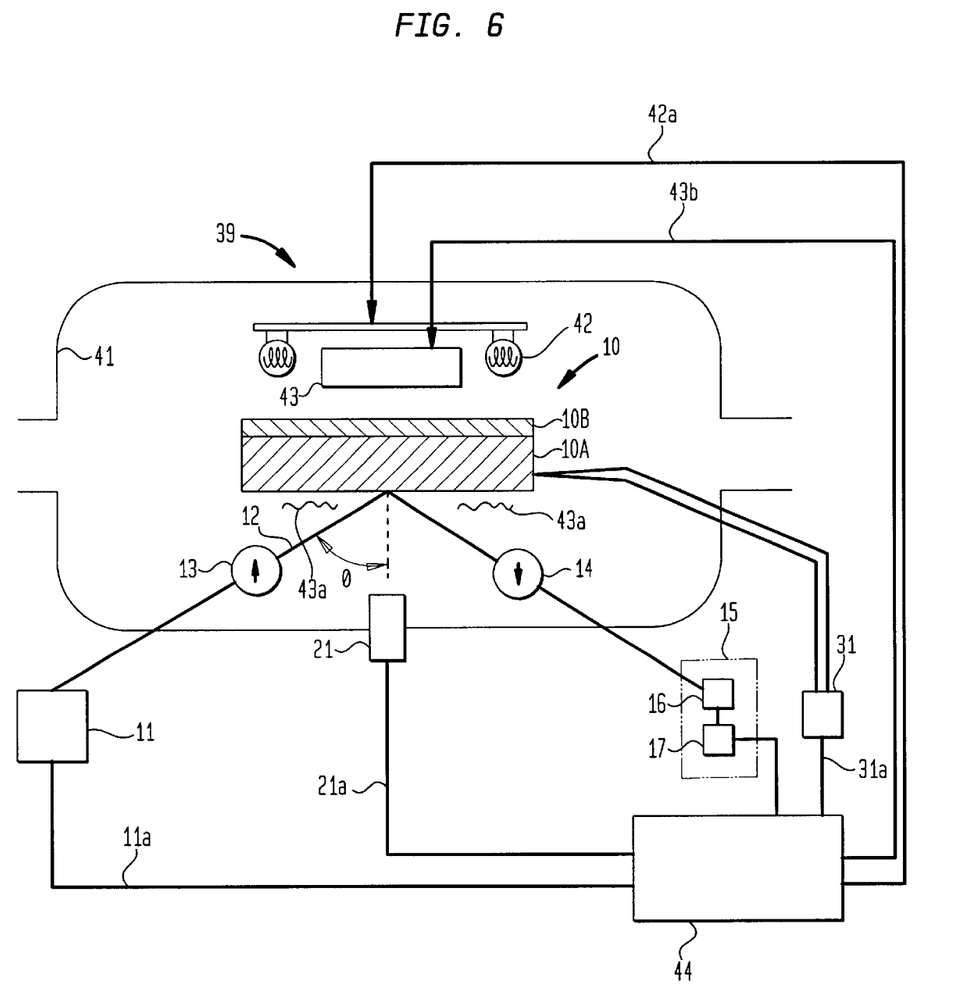
FIG. 6 is a silicon device fabrication apparatus that may be used in performing the inventive hybrid thermometry method.

FIG. 6 is a schematic diagram of an improved silicon workpiece processing apparatus 39 that may be used to perform the inventive method taking into account the presence of applied fabrication materials. Here, the silicon workpiece 10 is placed on a support (not shown) within chamber 41 for enclosing a controlled atmosphere, containing heating elements 42, such as lamps, for controllably heating the workpiece. The chamber contains a materials apparatus 43 for applying fabrication materials onto the workpiece, e.g., for coating the workpiece or removing or modifying materials on the workpiece. This can be a CVD apparatus, sputtering apparatus, evaporation apparatus, or other apparatus with which materials are applied to the workpiece or an annealing apparatus. An optical reflectance system is incorporated within apparatus 39, comprising a source 11 of a beam of ultraviolet light directed through polarizer 13 onto a surface 10A of the workpiece 10, advantageously at a relatively large angle of incidence $\phi$ (e.g., $\phi > 45$ degrees). The optical reflectance system further includes a second polarizer 14 and spectrum analyzing apparatus 15 such as a dispersion element 16 and array of photodetectors 17. For taking measurements under various surface conditions, a pyrometer 21 may be used with the system and/or a thermocouple 31, the latter being attached to the backside 10A of the workpiece.

As the workpiece is being processed, fabrication materials 43a are emitted from apparatus 43 and travel within chamber 41 to the workpiece to be applied to its active surface 10B. In a preferred processing scheme, the fabrication materials are blocked from reaching the backside of the wafer 10B, opposite the active surface. However, in other embodiments the fabrication materials may travel adjacent the opposite surface 10B of the workpiece, e.g., to substantially surround the workpiece, shown schematically at 43a. Thus, light directed onto the surface 10A of the workpiece may reflect off not only the workpiece but also off fabrication materials 43a being applied thereon. During processing, the optical reflectance apparatus may be used to measure the changed condition of the surface and then as the surface conditions change, further information can be obtained and used from the spectrum library. The calibration and thermometer may be changed during processing, but preferably the preferred thermometer and calibration is selected before deposition of the fabrication materials. The temperature of the workpiece can then be controlled with temperature information provided to a computer 44 for controlling the heating elements 42 via circuitry 42a. Real-time spectral data can be obtained, as fabrication materials are applied, with the optical reflectance apparatus. Using software of computer 44, the spectral data can be compared with the spectrum library previously stored in the computer and a decision made as to which measurement technique is to be used, e.g., the reflectance system, the pyrometer 21, or the thermocouple 31. The computer may be coupled to each of the measurement devices (e.g., via circuitry 11a, 21a, 31a), so that their data may be used as desired.

The temperature information is sent to the computer 44 for controlling the heating elements 42, and the computer also can use the temperature information to control via circuitry 43b the temperature-dependent processing apparatus 43. Thus, the temperature can be measured and controlled without contacting the workpiece over a wide temperature range, including temperatures below 500° C.; and accurate measurements may be made of the workpiece under various surface conditions.

It is to be understood that the above-described embodiments are illustrative of only a few of the may possible specific embodiments which can represent applications of the invention. Numerous and varied other arrangements can be made by those skilled in the art without departing from the spirit and scope of the invention. All such variations and modifications are intended to be included within the scope of the appended claims.

We claim:

1. A method for measuring the temperature of a silicon workpiece comprising the steps of:

(a) providing a conversion system for converting spectral data to a value of temperature;

(b) measuring the temperature of the silicon workpiece with optical reflectance thermometry comprising:
  (i) directing a beam of polarized light including ultraviolet light onto the silicon workpiece so the ultraviolet light is reflected off the workpiece to a spectrum analyzer;
  (ii) analyzing the spectrum of the light reflected off the workpiece with the spectrum analyzer to obtain spectral data; and
  (iii) converting the spectral data to a value of temperature utilizing the conversion system.

2. The method of claim 1, further comprising the steps of:
(c) coupling the conversion system to electronic circuitry or heating elements; and
(d) adjusting the electronic circuitry or heating elements based on the value of temperature obtained from the conversion system to control the temperature of the silicon workpiece.

3. The method of claim 1, in which the step of providing the conversion system further comprises providing a calibrated conversion system comprising the steps of:
  providing a test substrate,
  measuring the temperature of the test substrate with a thermometer comprising a thermocouple to obtain a first test value;
  measuring the temperature of the test substrate with optical reflectance thermometry to obtain a second test value comprising (i) directing a beam of polarized light including ultraviolet light onto the test substrate so the ultraviolet light is reflected off the substrate to a spectrum analyzer; (ii) analyzing the spectrum of the reflected light to obtain spectral data; and (iii) converting the spectral data to a value of temperature defining the second test value; and
  applying the first and second test values to calibrate the conversion system.

4. A method for measuring the temperature of a silicon workpiece during processing, the method comprising the steps of:
(a) providing a spectrum library including data relating to at least one test material of known composition;
(b) measuring the temperature of the silicon workpiece with optical reflectance thermometry to obtain real-time spectral data
(c) comparing the real-time spectral data with data in the spectrum library to determine the surface conditions;
(d) selecting a temperature measurement technique appropriate for the surface conditions; and
(e) measuring the temperature applying the temperature measurement technique selected according to step (d).

5. The method of claim 4, in which the silicon workpiece has at least one fabrication material applied on at least one of its surfaces before the method is performed.

6. The method of claim 5 in which the thermometer comprises a thermocouple.

7. The method of claim 4, in which the step of measuring the temperature of the silicon workpiece (step b) is performed as at least one fabrication material is applied on a surface of the workpiece.

8. The method of claim 7, in which the step of measuring the temperature of the silicon workpiece (step b) comprises:
  (i) directing a beam of polarized light including ultraviolet light onto the silicon workpiece as the at least one fabrication material is being applied so the ultraviolet light is reflected off the workpiece and the at least one fabrication material to a spectrum analyzer; and
  (ii) analyzing the spectrum of the light reflected off the workpiece and the at least one fabrication material with the spectrum analyzer to obtain the real-time spectral data.

9. The method of claim 7, in which the surface conditions determined according to step (c) comprise the composition and thickness of the at least one fabrication material being applied to the substrate.

10. The method of claim 4, in which the step of providing the spectrum library comprises:
(a) providing a test substrate and at least one test material of known composition for application to the test substrate,
(b) measuring the temperature of the test substrate and test material with a thermometer to obtain a first temperature value;
(c) measuring the temperature of the test substrate and the test material with optical reflectance to obtain spectral data; and
(d) applying the first temperature value to decompose the spectral data to a basis set of functions and coefficients for characterizing the composition and temperature of the at least one test material.

11. The method of claim 10, in which the test material has been applied on the surface of the test substrate so that the steps of measuring the temperature with a thermometer and optical reflectance (steps b and c), comprise measuring the temperature with the test substrate with the test material applied thereon.

12. The method of claim 10, in which the test material is applied on the surface of the test substrate so that the steps of measuring the temperature with a thermometer and optical reflectance (steps b and c), comprise measuring the temperature with the test substrate as the test material is being applied thereon.

13. The method of claim 4, in which the temperature measurement technique of step (d) is selected from optical reflectance, a pyrometer, and a thermocouple.

14. The method of claim 4, further comprising the step of sending temperature information obtained from the step of measuring the temperature (step e) to a computer for controlling the processing conditions.

15. The method of claim 14 in which the processing conditions include the temperature of the workpiece and the rate at which fabrication materials are applied to the workpiece.

* * * * *